(12) United States Patent
Liao et al.

(10) Patent No.: US 10,658,061 B2
(45) Date of Patent: May 19, 2020

(54) SHIFT REGISTER CIRCUIT, METHOD FOR DRIVING SHIFT REGISTER CIRCUIT, GATE ELECTRODE DRIVING CIRCUIT AND DISPLAY DEVICE

(71) Applicants: HEFEI BOE OPTOELECTRONICS TECHNOLOGY CO., LTD., Hefei, Anhui (CN); BOE TECHNOLOGY GROUP CO., LTD., Beijing (CN)

(72) Inventors: Liqing Liao, Beijing (CN); Hongmin Li, Beijing (CN); Zhifu Dong, Beijing (CN); Silin Feng, Beijing (CN)

(73) Assignees: HEFEI BOE OPTOELECTRONICS TECHNOLOGY CO., LTD., Hefei; Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/332,193

(22) PCT Filed: Aug. 21, 2018

(86) PCT No.: PCT/CN2018/101490
§ 371 (c)(1),
(2) Date: Mar. 11, 2019

(87) PCT Pub. No.: WO2019/042189
PCT Pub. Date: Mar. 7, 2019

(65) Prior Publication Data
US 2019/0272884 A1    Sep. 5, 2019

(30) Foreign Application Priority Data
Aug. 31, 2017 (CN) .......................... 2017 1 0771346

(51) Int. Cl.
*G11C 19/28* (2006.01)
*G09G 3/20* (2006.01)
*G11C 19/18* (2006.01)

(52) U.S. Cl.
CPC ............... *G11C 19/28* (2013.01); *G09G 3/20* (2013.01); *G11C 19/184* (2013.01); *G09G 2310/0286* (2013.01)

(58) Field of Classification Search
CPC .................. G11C 19/28; G11C 19/184; G09G 2310/0286; G09G 3/3677
See application file for complete search history.

(56) References Cited

U.S. PATENT DOCUMENTS 10,115,355 B2 * 10/2018 Zhang ..................... G09G 3/36

* cited by examiner

*Primary Examiner* — Sibin Chen
(74) *Attorney, Agent, or Firm* — Brooks Kushman P.C.

(57) ABSTRACT

A shift register circuit, a driving method, a gate driving circuit, and a display device are provided. The shift register circuit includes a clock signal adjustment circuit and a self-control conduction circuit; the clock signal adjustment circuit includes a first clock signal input terminal, a second clock signal input terminal, and a clock signal adjustment output terminal; the clock signal adjusting circuit is configured to, in the case that the first clock signal and the second clock signal are both at a second level, output a first level via a clock signal adjustment output terminal; the self-control conduction circuit is configured to, in the case that the pull-up node is at the first level, control the clock signal adjustment output terminal connect with a pull-up node, or in the case that the pull-up node is at a second level, disconnect the clock signal adjustment output terminal from the pull-up node.

15 Claims, 5 Drawing Sheets

US 10,658,061 B2

SHIFT REGISTER CIRCUIT, METHOD FOR DRIVING SHIFT REGISTER CIRCUIT, GATE ELECTRODE DRIVING CIRCUIT AND DISPLAY DEVICE

CROSS-REFERENCE TO RELATED APPLICATIONS

This application is the U.S. national phase of PCT Application No. PCT/CN2018/101490 filed on Aug. 21, 2018, which claims priority to Chinese Patent Application No. 201710771346.5 filed on Aug. 31, 2017, which are incorporated herein by reference in their entireties.

TECHNICAL FIELD

The present disclosure relates to the field of display driving technology, and in particular, relates to a shift register circuit, a method for driving a shift register circuit, a gate electrode driving circuit and a display device.

BACKGROUND

In an actual operation of a GOA (Gate electrode On Array), because a length-to-width ratio of channels of a first output transistor in an output module is generally much greater than that of other TFTs (Thin Film Transistor), an on-state current is large. The first output transistor is not only configured to output a gate electrode driving signal, but also to pull an output signal down instantaneously after the signal output is completed. In order to cooperate with this function of the first output transistor, the duty ratio of a first clock signal inputted by a first clock signal input terminal is generally set to be less than 50%, to ensure that there is a low-level time between the first clock signal inputted by the first clock signal input terminal and a second clock signal inputted by a second clock signal input terminal. During the first clock signal input terminal and the second clock signal input terminal simultaneously input the low-level, there is no reset signal pulling the potential of a pull-up node down, and the potential of the pull-up node maintains a high-level. Turning on the first output transistor may instantaneously pull down the gate electrode driving signal and completely turn off this row of pixel area TFT elements, thereby reducing the risk of mischarge. At this stage, the potential of the pull-up node is maintained by a storage capacitor module completely. Once the storage capacitor module has an electricity leakage, the potential of the pull-up node is lowered, and the first output transistor is turned on insufficiently, a rising edge and a falling edge of the output gate electrode driving signal will eventually become longer, the output waveform is distorted, the TFT device in the pixel area cannot be turned off in time, and the mischarge display is abnormal.

SUMMARY

A shift register circuit is provided in the present disclosure, including a clock signal adjustment circuit and a self-control conduction circuit, where the clock signal adjustment circuit includes a first clock signal input terminal, a second clock signal input terminal and a clock signal adjustment output terminal; the self-control conduction circuit is coupled to the clock signal adjustment output terminal and a pull-up node;

the first clock signal input terminal is configured to load a first clock signal, the second clock signal input terminal is configured to load a second clock signal, where both the first clock signal and the second clock signal have a first level and a second level, where the first level is an active operating level and is higher than a reference level;

the clock signal adjustment circuit is configured to, in the case that the first clock signal and the second clock signal are both at the second level, output the first level via the clock signal adjustment output terminal, where the second level is lower than the reference level;

the self-control conduction circuit is configured to, in the case that the pull-up node is at the first level, control the clock signal adjustment output terminal to connect with the pull-up node, or the self-control conduction circuit is configured to, in the case that the pull-up node is at the second level, disconnect the clock signal adjustment output terminal from the pull-up node.

Optionally, a duty ratio of the first clock signal and a duty ratio of the second clock signal are both less than 50%; a period of the first clock signal is the same as a period of the second clock signal, and a phase difference between the first clock signal and the second clock signal is 180°.

Optionally, the clock signal adjustment circuit includes:

a first node control sub-circuit, coupled to a first level input terminal, the second clock signal input terminal, a first node and a second level input terminal, and configured to control a potential of the first node according to a potential of the second clock signal;

a second node control sub-circuit, coupled to the first node, a second node, the first clock signal input terminal and the second level input terminal, and configured to control a potential of the second node according to a potential of the first clock signal and the potential of the first node; and a signal output sub-circuit, coupled to the second node and the clock signal adjustment output terminal, and configured to control, according to the potential of the second node, whether the second node is connected with the clock signal adjustment output terminal.

Optionally, the first node control sub-circuit includes:

a first control transistor, where both a gate electrode of the first control transistor and a first electrode of the first control transistor are coupled to the first level input terminal, and a second electrode of the first control is coupled to the first node; and a second control transistor, where a gate electrode of the second control transistor is coupled to the second clock signal input terminal, a first electrode of the second control transistor is coupled to the first node, and a second electrode of the second control transistor is coupled to the second level input terminal;

the second node control sub-circuit includes:

a third control transistor, where both a gate electrode and a first electrode of the third control transistor are coupled to the first node, and a second electrode of the third control transistor is coupled to the second node; and a fourth control transistor, where a gate electrode of the fourth control transistor is coupled to the first clock signal input terminal, a first electrode of the fourth control transistor is coupled to the second node, and a second electrode of the fourth control transistor is coupled to the second level input terminal;

the signal output sub-circuit includes:

a signal output transistor, where both a gate electrode and a first electrode of the signal output transistor are coupled to the second node, and a second electrode of the signal output transistor is coupled to the clock signal adjustment output terminal.

Optionally, both the first control transistor and the second control transistor are n-type transistors, the first level input terminal is a high-level input terminal, and the second level input terminal is a low-level input terminal; both the third control transistor and the fourth control transistor are n-type transistors; the signal output transistor is an n-type transistor.

Optionally, the clock signal adjustment circuit includes:

a first control sub-circuit, coupled to the first clock signal input terminal, a first level input terminal and a first control node, and configured to control, according to a potential of the first clock signal, whether the first control node is connected with the first clock node;

a second control sub-circuit, coupled to the second clock signal input terminal, a second control node, the first control node and a second level input terminal, and configured to control, according to a potential of the second clock signal, whether the second control node is connected with the first control node and whether the second control node is connected with the second level input terminal; and a pull-up output sub-circuit, coupled to the second control node and the clock signal adjustment output terminal, and configured to control, according to the potential of the second control node, whether the second control node is coupled to the clock signal adjustment output terminal.

Optionally, the first control sub-circuit includes: a first control transistor, where a gate electrode of the first control transistor is coupled to the first clock signal input terminal, a first electrode of the first control transistor coupled to the first level input terminal, and a second electrode of the first control transistor is coupled to the first control node;

the second control sub-circuit includes a second control transistor, where a gate electrode of the second control transistor is coupled to the second clock signal input terminal, a first electrode of the second control transistor is coupled to the first control node, and a second electrode of the second control transistor is coupled to the second control node; and a third control transistor, where a gate electrode of the third control transistor is coupled to the second clock signal input terminal, a first electrode of the third control transistor is coupled to the second control node, and a second electrode of the third control transistor is coupled to a low-level input terminal;

the pull-up output sub-circuit includes:

a pull-up output transistor, where both a gate electrode and a first electrode of the pull-up output transistor are coupled to the second control node, and a second electrode of the pull-up output transistor is coupled to the clock signal adjustment output terminal.

Optionally, both the first control transistor and the second control transistor are p-type transistors, and both the third control transistor and the pull-up output transistor are n-type transistors.

Optionally, the self-control conduction circuit includes a self-control conduction transistor, where a gate electrode of the self-control conduction transistor is coupled to the pull-up node, a first electrode of the self-control conduction transistor is coupled to the clock signal adjustment output terminal, and a second electrode of the self-control conduction circuit is coupled to the pull-up node.

Optionally, the self-control conduction transistor is an n-type transistor.

Optionally, the shift register circuit further includes: a first pull-down circuit, a pull-down node control circuit, a gate electrode driving signal output circuit and a second pull-down circuit, where the first pull-down circuit includes a first pull-down transistor, where a gate electrode of the first pull-down transistor is coupled to the pull-down node, a first electrode of the first pull-down transistor is coupled to the pull-up node, and a second electrode of the first pull-down transistor is coupled to the second level input terminal.

Optionally, the pull-down node control circuit includes a pull-down control node control sub-circuit, a pull-down node control sub-circuit and a start pull-down sub-circuit, where the pull-down control node control sub-circuit includes:

a first pull-down control node control transistor, where both a gate electrode and a first electrode of the first pull-down control node control transistor is coupled to the first level input terminal, a second electrode of the first pull-down control node control transistor is coupled to the pull-down control node; and a second pull-down node control transistor, where a gate electrode of the second pull-down node control transistor is coupled to the pull-up node, a first electrode of the second pull-down node control transistor is coupled to the pull-down control node, and a second electrode of the second pull-down node control transistor is coupled to the second level input terminal;

the pull-down node control sub-circuit includes:

a first pull-down node control transistor, where a gate electrode of the first pull-down node control transistor is coupled to the pull-down control node, a first electrode of the first pull-down node control transistor is coupled to the first level input terminal, and a second electrode of the first pull-down node control transistor is coupled to the pull-down node; and a second pull-down node control transistor, where a gate electrode of the second pull-down node control transistor is coupled to the pull-up node, a first electrode of the second pull-down node control transistor is coupled to the pull-down node, and a second electrode of the second pull-down node control transistor is coupled to the second level input terminal;

the start pull-down sub-circuit includes a start pull-down transistor, where both a gate electrode and a first electrode of the start pull-down sub-circuit are coupled to the start terminal, and a second electrode of the start pull-down sub-circuit is coupled to the pull-up node.

Optionally, the gate electrode driving signal output circuit includes: an output transistor, where a gate electrode of the output transistor is coupled to the pull-up node, a first electrode of the output transistor is coupled to the first clock signal input terminal, and a second electrode of the output transistor is coupled to the gate electrode driving signal output terminal; and a storage capacitor, where a first terminal of the storage capacitor is coupled to the pull-up node, and a second terminal of the storage capacitor is coupled to the gate electrode driving signal output terminal;

the second pull-down circuit includes: a second pull-down transistor, where a gate electrode of the second pull-down transistor is coupled to the pull-down node, a first electrode of the second pull-down transistor is coupled to the gate electrode driving signal output terminal, and a second electrode of the second pull-down transistor is coupled to the low-level input terminal.

A method for driving a shift register circuit is further provided in the present disclosure, which is applied to a shift register circuit as described above, where the method for driving a shift register circuit includes:

loading the first clock signal to the first clock signal input terminal;

loading the second clock signal to the second clock signal input terminal;

in the case that the first clock signal and the second clock signal are both at the second level, outputting, by the clock signal adjustment circuit, the first level via the clock signal adjustment output terminal; and in the case that the pull-up node is at the first level, controlling, by the self-control conduction circuit, the clock signal adjustment output terminal to connect with the pull-up node; or in the case that the pull-up node is at a second level, disconnecting, by the self-control conduction circuit, the clock signal adjustment output terminal from the pull-up node.

A gate electrode driving circuit is further provided in the present disclosure, including a plurality of shift register circuits connected in a cascade manner as described above.

A display device is further provided in the present disclosure, including a gate electrode driving circuit as described above.

DETAILED DESCRIPTION

Figure 1:
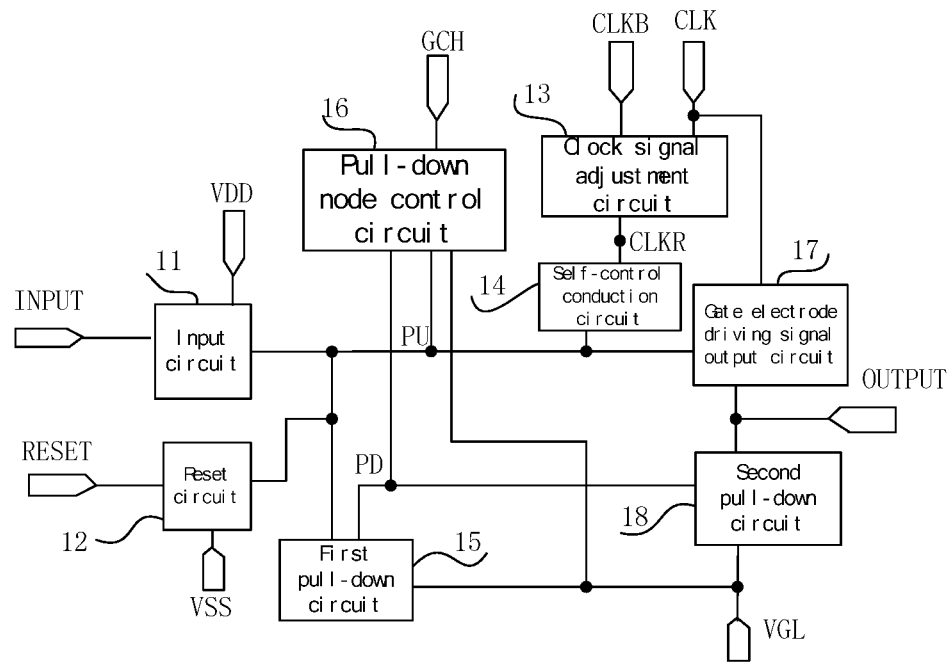
FIG. 1 is a schematic view of a shift register circuit in some embodiments of the present disclosure.

In order to more clearly illustrate the technical solutions of the embodiments of the present disclosure, the drawings to be used in the description of the embodiments of the present disclosure will be described briefly below. Obviously, the drawings in the following description are merely some embodiments of the present disclosure. For those skilled in the art, other drawings can also be obtained according to these drawings without any creative work.

A transistor employed in some embodiments of the present disclosure may be a thin film transistor or a field effect transistor or other device having the same characteristics. In some embodiments of the present invention, in order to distinguish two electrodes of the transistor except a gate electrode, one of the electrodes is referred to as a first electrode and the other electrode is referred to as a second electrode. In a practical operation, the first electrode may be a drain electrode, and the second electrode may be a source electrode; or the first electrode may be a source electrode, and the second electrode may be a drain electrode.

The shift register circuit in some embodiments of the present disclosure includes: a clock signal adjustment circuit and a self-control conduction circuit.

The clock signal adjustment circuit has a first clock signal input terminal, a second clock signal input terminal and a clock signal adjustment output terminal. The self-control conduction circuit is coupled to the clock signal adjustment output terminal and a pull-up node.

The first clock signal input terminal is loaded with a first clock signal, and the second clock signal input terminal is loaded with a second clock signal. A period of the first clock signal is the same as the period of the second clock signal. The duty ratio of the first clock signal and the duty ratio of the second clock signal are both less than 50%. The phase difference between the first clock signal and the second clock signal is 180°. Both of the first clock signal and the second clock signal have a first level and a second level, where the first level is an active operating level.

The clock signal adjustment circuit is configured to, in the case that the first clock signal and the second clock signal are both at the second level, output the first level via the clock signal adjustment output terminal.

The self-control conduction circuit is configured to, in the case that the pull-up node is at the first level, control the clock signal adjustment output terminal to connect with the pull-up node. The self-control conduction circuit is configured to, in the case that the pull-up node is at the second level, disconnect the clock signal adjustment output terminal from the pull-up node.

The shift register circuit in some embodiments of the present disclosure includes the clock signal adjustment circuit and the self-control conduction circuit. In the case that the first clock signal loaded to the first clock signal input terminal and the second clock signal loaded to the second clock signal input terminal are both at the second level, the potential of the pull-up node may be controlled and maintained at the first level. Therefore, the potential maintaining characteristics of the pull-up node may be enhanced, the distortion of the output waveform caused by an electricity leakage of the pull-up node and the pixel electrode mischarged may be solved, and the overall reliability of the shift register circuit may be improved. Furthermore, based on the potential of the first clock signal and the potential of the second clock signal, the clock signal adjustment circuit of the shift register circuit in some embodiments of the present disclosure controls the output of the first level when both the first clock signal and the second clock signal are at a second level, so as to maintain the potential of the pull-up node without adding the signal line in addition, thereby reducing a power consumption.

The pull-up node refers to a connection point of an input circuit, an output circuit and a reset circuit in the shift register circuit. Specifically, the shift register circuit may include: an input transistor, an output transistor and a storage capacitor; a gate electrode of the input transistor is coupled to an input terminal, and a first electrode of the input transistor is coupled to a first voltage input terminal; a first electrode of the output transistor is coupled to a first clock signal input terminal, and a second electrode of the output transistor is coupled to a gate electrode driving signal output terminal; a first terminal of the storage capacitor is coupled to the a electrode of the output transistor; a second terminal of the storage capacitor is coupled to an output terminal of the gate electrode driving signal; the connection point of the second electrode of the input transistor, the first terminal of the storage capacitor and the gate electrode of the output transistor is the pull-up node.

The active operating level is a level which is capable of controlling the conduction of the output transistor. In this case, the first clock signal input terminal is connected with the gate electrode driving signal output terminal.

Figure 4:
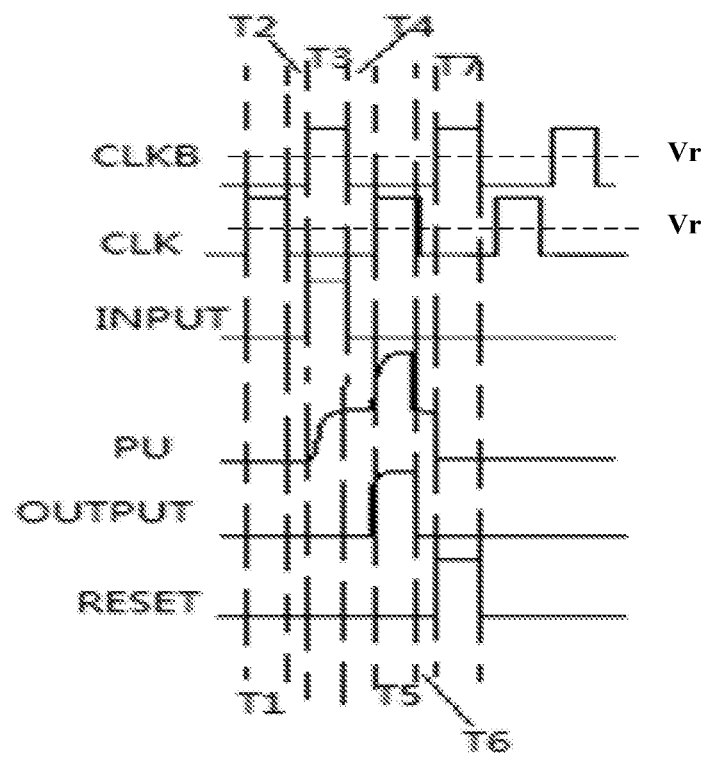
FIG. 4 is a working timing diagram of a shift register circuit in some embodiments of the present disclosure.

As shown in FIG. 4, the first level is higher than the reference level Vr, and the second level is lower than the reference level Vr. In a practical operation, in the case that the output transistor is an n-type transistor, the active operating level may be a high level. In the specific operation, the first level may be a high-level and the second level may be a low level.

In the case that the duty ratio of the first clock signal loaded to the first clock signal input terminal and the duty ratio of the first clock signal loaded to the second clock signal input terminal are both less than 50%, the first clock signal and the second clock signal are both at a low level.

As shown in FIG. 1, the shift register circuit in some embodiments of the present disclosure includes:

an input circuit 11, coupled to the input terminal INPUT, the pull-up node PU and a high voltage input terminal configured to input a high voltage VDD, and configured to control, according to a potential of the input terminal INPUT, whether the pull-up node PU is connected with the high voltage input terminal configured to input the high voltage VDD;

a reset circuit 12, coupled to the reset terminal RESET, the pull-up node PU and a low voltage input terminal configured to input a low voltage VSS, and configured to control, according to a potential of the reset terminal RESET, whether the pull-up node PU is connected with the low voltage input terminal configured to input the low voltage VSS;

a clock signal adjustment circuit 13, including a first clock signal input terminal CLK, a second clock signal input terminal CLKB and a clock signal adjustment output terminal the CLKR, and configured to, in the case that the first clock signal loaded to the first clock signal input terminal CLK and the second clock signal loaded to the second clock signal input terminal CLKB are both at the second level, output the first level through the clock signal adjustment output terminal CLKR;

a self-control conduction circuit 14, coupled to the pull-up node PU and the clock signal adjustment output terminal the CLKR, and configured to, in the case that the pull-up node PU is at the first level, control the clock signal adjustment output terminal CLKR to connect to the pull-up node PU, and in the case that the pull-up node PU is at the second level, disconnect the clock signal adjustment output terminal CLKR from the pull-up node PU;

a first pull-down circuit 15, coupled to a pull-down node PD, the pull-up node PU and a low-level input terminal configured to input a low-level VGL, and configured to control, according to a potential of the pull-down node PD, whether the pull-up node PU is connected with the low-level input terminal configured to input the low-level VGL;

a pull-down node control circuit 16, coupled to a high-level input terminal configured to input a high-level GCH, the pull-down node PD, the pull-up node PU and the low-level input terminal configured to input the low-level VGL, and configured to, according to the potential of the pull-up node PU, control the potential of the pull-down nodes PD;

a gate electrode driving signal output circuit 17, coupled to the pull-up node PU, the first clock signal input terminal CLK and the gate electrode driving signal output terminal OUTPUT, and configured to control, according to the potential of the pull-up node PU, whether the gate electrode driving signal output terminal OUTPUT is connected with the first clock signal input terminal CLK; and a second pull-down circuit 18, coupled to the pull-down nodes PD, the gate electrode driving signal output terminal OUTPUT and the low-level input terminal VGL, and configured to control, according to the potential of the pull-down nodes PD, whether the gate electrode driving signal output terminal OUTPUT is connected with the low-level input terminal configured to input the low-level VGL.

As shown in FIG. 1, the shift register circuit in some embodiments of the present disclosure includes the clock signal adjustment circuit 13 and the self-control conduction circuit 14, so as to control the potential of the pull-up node PU to maintain at the first level, in the case that the first clock signal input by the first clock signal input terminal CLK and the second clock signal input by the second clock signal input terminal CLKB are both at the second level, thereby improving the potential maintaining characteristics of the pull-up node PU, solving the distortion of the output waveform caused by the electricity leakage of the pull-up node and the pixel electrode mischarging, and improving the overall reliability of the shift register circuit. In addition, according to the potential of the first clock signal and the potential of the second clock signal, the clock signal adjustment circuit 13 outputs the first level based on the potential of the first clock signal and the potential of the second clock signal, when both the first clock signal and the second clock signal are at the second level, so as to maintain the potential of the pull-up node without adding the signal line in addition, thereby reducing the power consumption.

In the practical operation, the clock signal adjusting circuit 13 may also be coupled to the high-level input terminal configured to input the high-level GCH and the low-level input terminal configured to input the low-level VGL.

Figure 2:
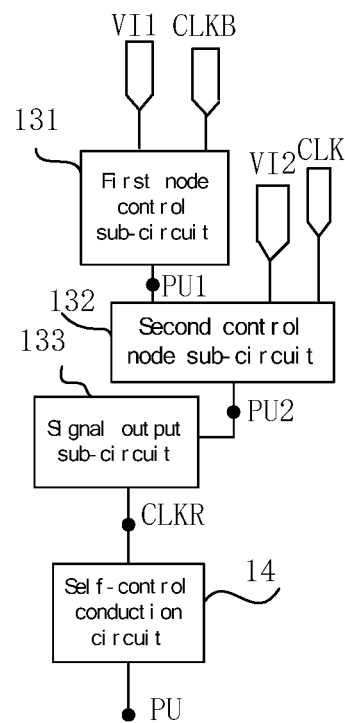
FIG. 2 is a schematic view of a shift register circuit in some embodiments of the present disclosure.

Specifically, as shown in FIG. 2, the clock signal adjustment circuit may include:

a first node control sub-circuit 131, coupled to a first level input terminal VI1, the second clock signal input terminal CLKB, a first node PU1 and a second level input terminal VI2, and configured to, according to an input potential of the second clock signal input terminal CLKB, control a potential of the first node PU1;

a second node control sub-circuit 132, coupled to the first node PU1, a second node PU2, the first clock signal input terminal CLK and a second level input terminal VI2, and configured to, according to an input potential of the first clock signal input terminal CLK and the potential of the first node PU1, control a potential of the second node PU2; and a signal output sub-circuit 133, coupled to the second node PU2 and the clock signal adjustment output terminal CLKR, and configured to control, according to the potential of the second node PU2, whether the second node PU2 is connected with the clock signal adjustment output terminal CLKR.

In some embodiments of the present disclosure, the first node control sub-circuit may include:

a first control transistor, in which both a gate electrode of a first control transistor and a first electrode of the first control transistor are coupled to the first level input terminal, and a second electrode of the first control transistor is coupled to the first node; and a second control transistor, in which a gate electrode of the second control transistor is coupled to the second clock signal input terminal, a first electrode of the second control transistor is coupled to the first node, and a second electrode of the second control transistor is coupled to the second level input terminal.

In the practical operation, both the first control transistor and the second control transistor may be n-type transistors; the first level input terminal may be a high-level input terminal; and the second level input terminal may be a low-level input terminal.

The second node control sub-circuit may include:

a third control transistor, in which both a gate electrode and a first electrode of the third control transistor are coupled to the first node, and a second electrode of the third control transistor is coupled to the second node; and a fourth control transistor, in which a gate electrode of the fourth control transistor is coupled to the first clock signal input terminal, a first electrode of the fourth control transistor is coupled to the second node, and a second electrode of the fourth control transistor is coupled to the second level input terminal.

Specially, both the third control transistor and the fourth control transistor may be n-type transistors; the second level input terminal may be a low-level input terminal.

the signal output sub-circuit may include:

a signal output transistor, in which both a gate electrode and a first electrode of the signal output transistor are coupled to the second node, and a second electrode of the signal output transistor is coupled to the clock signal adjustment output terminal.

In practical operation, the signal output transistor is an n-type transistor.

In the specific implementation, the self-control conduction circuit may include: a self-control conduction transistor, in which a gate electrode of the self-control conduction circuit is coupled to the pull-up node, a first electrode of the self-control conduction circuit is coupled to the clock signal adjustment output terminal, and a second electrode of the self-control conduction circuit is coupled to the pull-up node.

In practical operation, the self-control conduction transistor is an n-type transistor.

Figure 3:
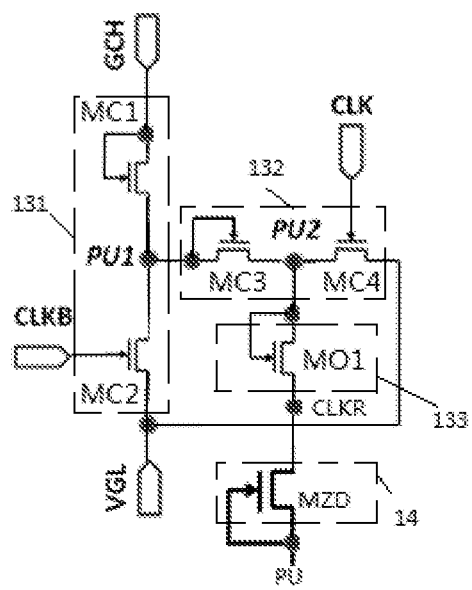
FIG. 3 is a circuit diagram of a clock signal adjustment circuit included in a shift register circuit in some embodiments of the present disclosure.

Specially, as shown in FIG. 3, the first node control sub-circuit 131 may include:

a first control transistor MC1, in which both a gate electrode of the first control transistor MC1 and a source electrode of the first control transistor MC1 are coupled to a high-level input terminal configured to input a high-level GCH, and a drain electrode of the first control transistor MC1 is coupled to the first node PU1; and a second control transistor MC2, in which a gate electrode of the second control transistor MC2 is coupled to the second clock signal input terminal CLKB, a source electrode of the second control transistor MC2 is coupled to the first node PU1, and a drain electrode of the second control transistor MC2 is coupled to a low-level input terminal configured to input a low-level VGL;

the second node control sub-circuit 132 may include:

a third control transistor MC3, in which both a gate electrode and a source electrode of the third control transistor are coupled to the first node PU1, and a drain electrode of the third control transistor is coupled to the second node PU2; and a fourth control transistor MC4, in which a gate electrode of the fourth control transistor is coupled to the first clock signal input terminal CLK, a source electrode of the fourth control transistor is coupled to the second node PU2, and a drain electrode of the fourth control transistor is coupled to a low-level input terminal configured to input a low-level VGL;

the signal output sub-circuit 133 may include:

a signal output transistor MO1, in which both a gate electrode and a source electrode of the signal output transistor MO1 are coupled to the second node PU2, and a second electrode of the signal output transistor MO1 is coupled to the clock signal adjustment output terminal CLKR.

The self-control conduction circuit 14 includes:

a self-control conduction transistor MZD, in which a source electrode of the self-control conduction transistor MZD is coupled to the clock signal adjustment output terminal CLKR, both a gate electrode of the self-control conduction transistor MZD and a drain electrode of the self-control conduction transistor MZD are coupled to the pull-up node PU. In practical operation, the self-control conduction transistor MZD is an n-type transistor. In the case that the self-control conduction transistor MZD is an n-type transistor and the potential of the pull-up node PU is at a high level, the self-control conduction transistor MZD may control the pull-up node PU couple to the clock signal adjustment output terminal CLKR.

As shown in FIG. 3, in some embodiments of the present disclosure, MC1, MC2, MC3, MC4, MO1 and MZD are all n-type transistors. In practical operation, MC1, MC2, MC3 and MC4 also may be p-type transistors.

As shown in FIG. 3, in some embodiments of the present disclosure, the gate electrode of MC1 and the source electrode of MC1 are shorted, and coupled to the high-level input configured to input the high-level GCH; the drain electrode of MC1 is coupled to the source electrode of MC2, the gate electrode of MC2 is controlled by the CLKB, and the drain electrode of MC2 is coupled to VGL. A non-gate structure may be formed between the CLKB and PU1 by designing a channel aspect ratio of MC1 and a channel aspect ratio of MC2. In other words, in the case that the second clock signal inputted by the CLKB is at the high level, the potential of PU1 is at the low level; conversely, in the case that the second clock signal inputted by the CLKB is at the low level, a potential of the PU1 is at the high level. Similarly, a non-gate structure may be formed between the CLK and the PU2 by designing a channel aspect ratio of MC3 and the channel aspect ratio of MC4. In other words, in the case that the first clock signal is at the high level, the potential of the PU2 is at the low level; in the case that the first clock signal inputted by the CLK is at the low level, the potential of the PU2 is at the high level. The MO1 and the MZD are mainly for used a unidirectional conduction.

As shown FIG. 4, when the shift register circuit of the clock signal adjustment circuit shown in FIG. 3 in the present disclosure is in operation, in the first phase T1, the CLKB inputs a low level, the CLK inputs a high level, the potential of the PU is at the low level, and the potential of the PU1 is at the high level; at this time, both the MC3 and the MC4 are turned on, so that the potential of the PU2 is at the low level; both the MO1 and the MZD are turned off, and the clock signal adjustment output the CLKR has no output;

in the second phase T2, both the CLKB and the CLK inputs low levels, the potential of the PU is at the low level, the MC1 is turned on, the MC2 is turned off, the potential of the PU1 is at the high level, the MC3 is turned on, the MC4 is turned off, and the potential of the PU2 is at the high level, the MO1 is conducted, the CLKR outputs the high level; since the potential of the PU is at the low level and the MZD is turned off, the self-control conduction circuit disconnects the CLKR from PU;

in the third phase T3 (i.e., the input phase, in this phase, INPUT inputs the high level), the CLKB inputs the high level, the CLK inputs a low level, the potential of the PU is at the high level, both the MC1 and the MC2 are conducted, the potential of the PU1 is at low level, the M12 is disconnected, the M13 is disconnected, the potential of the PU2 is maintained at the low level, the MO1 is turned off, and the CLKR has no output;

in the fourth phase T4, both the CLKB and the CLK inputs the low level, the potential of the PU is at the high level, the MC2 is turned off; the MC1 is conducted, the potential of the PU1 is at the high level, the MC2 is conducted, the MC4 is disconnected, the potential of the PU2 is at the high level, both the MO1 and the MZD are conducted, so that the CLKR outputs a high level, and the PU is connected to the CLKR, and the potential of the PU may be better maintained at the high level when both the CLKB and the CLK input low levels, thereby increasing a high potential retentivity of the pull-up node PU;

In the fifth stage T5 (i.e., the input phase, in this phase, the OUTPUT outputs the high level), the CLKB inputs the low level, the CLK inputs the high level, the potential of the PU is at the high level, the MC1 is conducted, the MC2 is disconnected, the potential of the PU1 is at the high level, both the MC3 and the MC4 are conducted, the potential of the PU2 is at the low level, MO1 is turned off, and the CLKR has no output;

in the sixth phase T6, both the CLKB and the CLK inputs the low level, the potential of the PU is at high level, and the MC2 is turned off, the MC1 is conducted, the potential of the PU1 is at the high level, the MC2 is conducted, the MC4 is disconnected, the potential of the PU2 is at the high level, both the MO1 and the MZD are conducted, so that the CLKR outputs a high level, the PU is coupled to the CLKR, and the potential of the PU may be better maintained at the high level when both the CLKB and the CLK input low levels, thereby increasing a high potential retentivity of the pull-up node PU;

in the seventh phase T7 (i.e., the reset phase, in this phase, RESET inputs the high level, so that the potential of the pull-up node PU is reset to a low voltage), the CLKB inputs the high level, the CLK input the low level; in this phase, since the potential of pull-up node PU is at the low voltage, the MZD is turned off to disconnect the PU from the CLKR.

It can be seen from the above, that in the case that the potential of the PU is at the high level and both the CLK and the CLKB input the low level, the potential of the PU2 is at the high level, the CLKR outputs the high level, and the PU and the CLKR are conducted, thereby further maintaining a high potential of the PU. When both the CLK and the CLKB input the low level, the electricity leakage of the pull-up node PU is readily to occur during this period, resulting in distortion of the output waveform of the GOA (Gate On Array, gate electrode driving circuit arranged on the array substrate). Coupling PU2 to the PU can effectively enhance the high potential retention characteristics of the pull-up node PU. In the corresponding phase, the potential of the pull-up node PU maintains at the high level, the first output transistor in the output circuit is relatively fully opened, the rising edges and the falling edges of the GOA output waveform are greatly shortened, and the output waveform is close to the ideal waveform. Thus, the risk of mischarging caused by the pixel TFT not being turned off in time due to the distortion of the GOA output waveform is greatly reduced.

Figure 5:
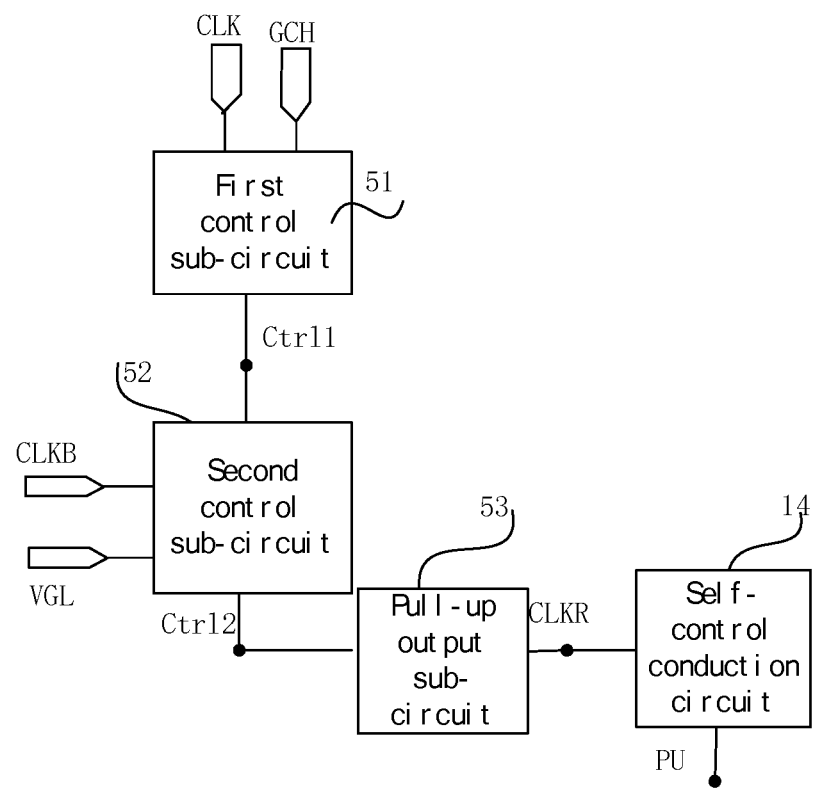
FIG. 5 is a circuit diagram of a clock signal adjustment circuit included in a shift register circuit in some embodiments of the present disclosure.

In some embodiments of the present disclosure, as shown in FIG. 5, the clock signal adjustment circuit may include:

a first control sub-circuit 51, coupled to the first clock signal input terminal CLK, a high-level input terminal configured to input the high level GCH and a first control node Ctrl1, and configured to control, according to a potential of the first clock signal, whether the first control node Ctrl1 is connected with the high-level input terminal configured to input the high level GCH;

a second control sub-circuit 52, coupled to the second clock signal input terminal CLKB, a second control node Ctrl2, the first control node Ctrl1 and a low-level input terminal configured to input the low level VGL, and configured to control, according to a potential of the second clock signal, whether the second control node Ctrl2 is connected with the first control node Ctrl1 and whether the second control node Ctrl2 is connected with the low-level input terminal configured to input the low level VGL; and a pull-up output sub-circuit 53, coupled to the second control node Ctrl2 and the clock signal adjustment output terminal CLKR, and configured to control, according to the potential of the second control node Ctrl2, whether the pull-up node PU is connected with the clock signal adjustment output terminal CLKR.

The self-control conduction circuit 14 is coupled to the clock signal adjustment output terminal CLKR and the pull-up node PU, and configured to, in the case that the potential of the pull-up node PU is at a first level, control the pull-up node PU to connect with the signal adjustment output terminal CLKR or the self-control conduction circuit is configured to, or the self-control conduction circuit 14 is configured to, in the case that the pull-up node PU is at the second level, disconnect the clock signal adjustment output terminal CLKR from the pull-up node PU.

In some embodiments of the present disclosure, in the case that the clock signal adjustment circuit shown in FIG. 5 is in operation, when the CLK inputs the low level, the first control sub-circuit 51 controls the Ctrl1 to connect with the high-level input terminal configured to input the high level GCH, so that the potential of the Ctrl is at the high level; when the CLKB also inputs the low level, the second control sub-circuit 52 controls Ctrl2 to connect with Ctrl1, and controls Ctrl2 to disconnect from the low level input terminal of the input low level VGL to control the potential of the Ctrl2 to be at the high level; the pull-up output sub-circuit 53 controls the CLKR to connect with the Ctrl2, such that CLKR outputs the high level; when the potential of the pull-up node PU is at the high level, the self-control conduction circuit 14 controls the PU to couple to the CLKR. Therefore, the maintaining potential characteristics of the pull-up node UP may be enhanced, the distortion of the output waveform caused by the electricity leakage of the pull-up node and the problem of the pixel electrode mischarged may be improved, and the overall reliability of the shift register circuit may be improved.

In some embodiments of the present disclosure, in the case that the clock signal adjustment circuit shown in FIG. 5 is in operation, when the CLK inputs the high level, the first control sub-circuit 51 controls the Ctrl1 not to connect with the high-level input terminal configured to input the high level GCH; when the CLK inputs the high level, the second control sub-circuit 51 controls the Ctrl2 not to connect with the Ctrl1, and controls the Ctrl2 to connect with the low-level input terminal configured to input the low level VGL to control the potential of the Ctrl2 to be at the low level, such that the pull-up output sub-circuit 53 controls CLKR not to connect with the Ctrl2, and the CLKR has no output.

In some embodiments of the present disclosure, in the case that the clock signal adjustment circuit shown in FIG. 5 is in operation, when the CLK inputs the low level and the CLKB inputs the high level, the first control sub-circuit 51 controls Ctrl1 to connect with the high-level input terminal of the input high level VGH, the second control sub-circuit 52 controls the Ctrl2 not to connect with the Ctrl1, and controls the Ctrl2 to connect with the low-level input terminal configured to input the low level VGL, the potential of the Ctrl2 is at the low level, the pull-up output sub-circuit 53 controls CLKR not to conduct with the Ctrl2, and the CLKR has no output.

In some embodiments of the present disclosure, in the case that the clock signal adjustment circuit shown in FIG. 5 is in operation, when the CLK inputs the high level and the CLKB inputs the low level, the first control sub-circuit 51 controls Ctrl1 to connect with the high-level input terminal of the input high level VGH, the second control sub-circuit 52 controls the Ctrl2 not to connect with the Ctrl1, and controls the Ctrl2 to connect with the low-level input terminal configured to input the low level VGL, the Ctrl2 is suspended, the pull-up output sub-circuit 53 controls CLKR not to conduct with the Ctrl2, and the CLKR has no output.

Specifically, the first control sub-circuit may include: a first control transistor, in which a gate electrode of the first control transistor is coupled to the first clock signal input terminal, a first electrode of the first control transistor coupled to the first level input terminal, and a second electrode of the first control transistor is coupled to the first control node;

the second control sub-circuit may include: a second control transistor, in which a gate electrode of the second control transistor is coupled to the second clock signal input terminal, a first electrode of the second control transistor is coupled to the first control node, and a second electrode of the second control transistor is coupled to the second control node; and a third control transistor, in which a gate electrode of the third control transistor is coupled to the second clock signal input terminal, a first electrode of the third control transistor is coupled to the second control node, and a second electrode of the third control transistor is coupled to a low-level input terminal;

the pull-up output sub-circuit may include: a pull-up output transistor, in which both a gate electrode and a first electrode of the pull-up output transistor are coupled to the second control node, and a second electrode of the pull-up output transistor is coupled to the clock signal adjustment output terminal;

the self-control conducting circuit may include:

a self-control conduction transistor, in which a gate electrode of the self-control conducting circuit is coupled to the pull-up node, a first electrode of the self-control conducting circuit is coupled to the clock signal adjustment output terminal, and a second electrode of the self-control conducting circuit is coupled to the pull-up node.

In practical operation, both the first control transistor and the second control transistor are p-type transistors, and the third control transistor, the pull-up output transistor and the self-control conduction transistor are all n-type transistors.

Figure 6:
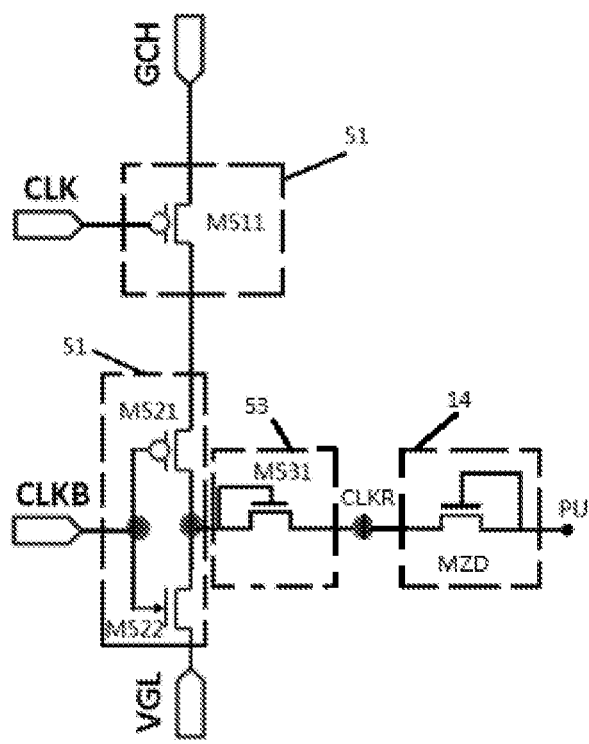
FIG. 6 is a circuit diagram of a clock signal adjustment circuit included in a shift register circuit in some embodiments of the present disclosure.

As shown in FIG. 6, in the clock signal adjustment circuit in some embodiments of the present disclosure, the first control sub-circuit 51 includes: a first control transistor M511, in which a gate electrode of the first control transistor M511 is coupled to a first clock signal input terminal CLK, the source electrode is coupled to the high-level input terminal configured to input the high level GCH, and the drain electrode is coupled to the first control node Ctrl1;

the second control sub-circuit 52 may include: a second control transistor M521, in which a gate electrode of the second control transistor M521 is coupled to the second clock signal input terminal CLKB, a source electrode thereof is coupled to the first control node Ctrl1, a drain electrode thereof is coupled to the second control node Ctrl2 connection; and a third control transistor M522, in which a gate electrode of the third control transistor M522 is coupled to the second clock signal input terminal CLKB, a drain electrode of the third control transistor M522 is coupled to the second control node Ctrl2, and a source electrode of the third control transistor M522 is coupled to the low-level input terminal configured to input the low level VGL;

the pull-up output sub-circuit 53 includes: a pull-up output transistor M531, the gate electrode of the pull-up output transistor M531 and the source electrode of the pull-up output transistor M531 are both coupled to the second control node Ctrl2, and the drain electrode of the pull-up output transistor M531 is coupled to the clock signal adjustment output terminal CLKR;

the self-control conduction circuit 14 includes:

a self-control transistor MZD, in which a gate electrode of the self-control transistor MZD is coupled to the pull-up node PU, a source electrode of the self-control transistor MZD is coupled to the clock signal adjustment output terminal CLKR, and a drain electrode of the self-control transistor MZD is coupled to the pull-up node PU.

In some embodiments of the present disclosure, in the case that the clock signal adjustment circuit shown in FIG. 6 is in operation, when both the CLK and the CLKB input the low level, both M511 and M521 are conducted, so that both the potential of the Ctrl1 and the potential of the Ctrl2 are at the high level, M531 is conducted, and the CLKR outputs the high level; when the potential of the PU is at the high level, the MZD is also conducted, so that the PU is connected with the CLKR, thereby further maintaining the potential of the PU at the high level;

when both the CLK and the CLKB input the high level, the M511 is disconnected from the M521, the M522 is conducted, the M531 is disconnected, the CLKR has no output, and the PU is not connected with the Ctrl2;

when the CLK inputs the low level and the CLKB inputs the high level, the M511 is conducted, the M521 is disconnected, the MZD is conducted, the potential of the Ctrl2 is at the low level, the M531 is disconnected, the CLKR has no output, the PU is not connected with the Ctrl2;

when the CLK inputs the high level and the CLKB inputs the low level, the M511 is disconnected, the M521 is conducted, the M522 is disconnected, the Ctrl2 is suspended, the CLKR has no output, and the PU is not connected with the Ctrl2.

In practical operation, the input circuit may include:

an input transistor, in which a gate electrode of the input transistor is coupled to the input terminal, a first electrode of the input transistor is coupled to a high voltage input terminal, a second electrode of the input transistor is coupled to the pull-up node;

the reset circuit may include:

a reset transistor, in which a gate electrode of the reset transistor is coupled to the reset terminal, a first electrode of the reset transistor is coupled to the pull-up node, and a second electrode of the reset transistor is coupled to the low voltage input terminal;

the first pull-down circuit may include:

a first pull-down transistor, in which a gate electrode of the first pull-down transistor is coupled to the pull-down node, a first electrode of the first pull-down transistor is coupled to the pull-up node, and a second electrode of the first pull-down transistor is coupled to the low-level input terminal;

the gate electrode driving signal output circuit may include:

an output transistor, in which a gate electrode of the output transistor is coupled to the pull-up node, a first electrode of the output transistor is coupled to the first clock signal input terminal, and a second electrode of the output transistor is coupled to the gate electrode driving signal output terminal; and a storage capacitor, in which a first terminal of the storage capacitor is coupled to the pull-up node, and the second terminal of the storage capacitor is coupled to the gate electrode driving signal output terminal;

the second pull-down circuit may include:

a second pull-down transistor, in which a gate electrode of the second pull-down transistor is coupled to the pull-down node, a first electrode of the second pull-down transistor is coupled to the gate electrode driving signal output terminal, and the second electrode of the second pull-down transistor is coupled to the low-level input terminal.

Specifically, the pull-down node control circuit may include:

a pull-down control node control sub-circuit, coupled to the high-level input terminal, the pull-down control node, the low-level input terminal, and the pull-up node, and configured to control the potential of the pull-up control node under the control of the pull-up node; and a pull-down node control sub-circuit, coupled to the pull-up node, the pull-down node, the pull-down control node, the high-level input terminal, and the low-level input terminal, configured to control whether the pull-down node is coupled to the high-level input terminal under the control of the pull-down control node, and configured to control whether the pull-down node is coupled to the low-level input terminal under the control of the pull-up node.

In practical operation, the pull-down node control circuit may further include: a start pull-down sub-circuit, coupled to a start terminal and the pull-down node, and configured to control whether the start terminal is coupled to the pull-down node under the control of the start terminal.

Specifically, the pull-down control node control sub-circuit may include:

a first pull-down control node control transistor, in which both a gate electrode and a first electrode of the first pull-down control node control transistor is coupled to the high-level input terminal, a second electrode of the first pull-down control node control transistor is coupled to the pull-down control node; and a second pull-down node control transistor, in which a gate electrode of the second pull-down node control transistor is coupled to the pull-up node, a first electrode of the second pull-down node control transistor is coupled to the pull-down control node, and a second electrode of the second pull-down node control transistor is coupled to the low-level input terminal;

the pull-down node control sub-circuit may include:

a first pull-down node control transistor, which a gate electrode of the first pull-down node control transistor is coupled to the pull-down control node, a first electrode of the first pull-down node control transistor is coupled to the high-level input terminal, and a second electrode of the first pull-down node control transistor is coupled to the pull-down node; and a second pull-down node control transistor, in which a gate electrode of the second pull-down node control transistor is coupled to the pull-up node, a first electrode of the second pull-down node control transistor is coupled to the pull-down node, and a second electrode of the second pull-down node control transistor is coupled to the low-level input terminal;

the start pull-down sub-circuit includes: a start pull-down transistor, in which both a gate electrode and a first electrode of the start pull-down sub-circuit are coupled to the start terminal, and a second electrode of the start pull-down sub-circuit is coupled to the pull-up node.

Figure 7:
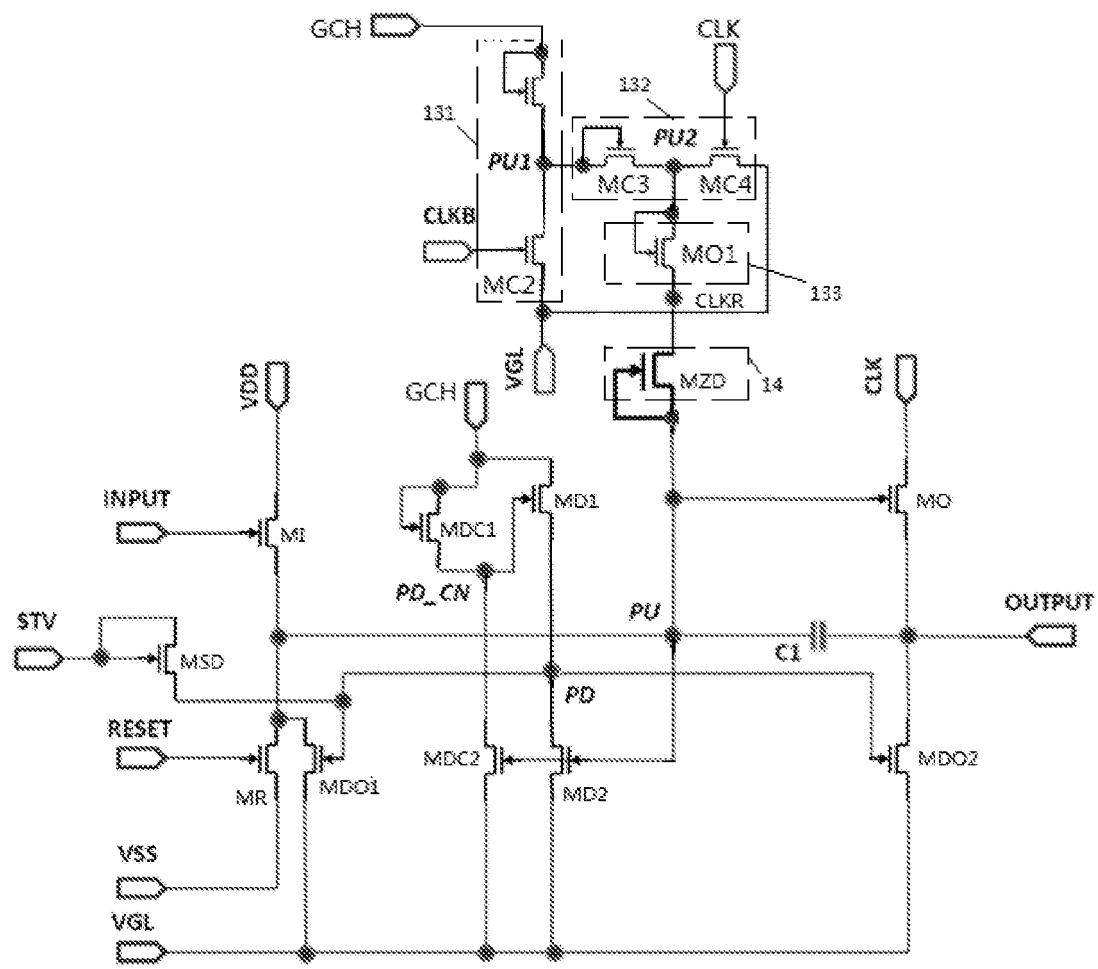
FIG. 7 is a schematic view of a shift register circuit in some embodiments of the present disclosure.

As shown in FIG. 7, the shift register circuit in some embodiments of the present disclosure includes: an input circuit, a reset circuit, a clock signal adjustment circuit, a self-control conduction circuit, a pull-down node control circuit, an output circuit, a first pull-down circuit and a second pull-down circuit, in which the input circuit includes:

an input transistor MI, in which a gate electrode of the input transistor MI is coupled to the input terminal INPUT, the source electrode of the input transistor MI is coupled to a high voltage input terminal configured to input a high voltage VDD, and a drain electrode of the input transistor MI is coupled to a pull-up node PU;

the reset circuit includes:

a reset transistor MR, in which a gate electrode of the reset transistor MR is coupled to a reset terminal RESET, a source electrode of the reset transistor MR is coupled to the pull-up node PU, and a drain electrode of the reset transistor MR is coupled to a low voltage input terminal configured to input a low voltage VSS;

the first pull-down circuit includes:

a first pull-down transistor MDO1, in which a gate electrode of the first pull-down transistor MDO1 is coupled to a pull-down node PD, a source electrode of the first pull-down transistor MDO1 is coupled to the pull-up node PD, and a drain electrode of the first pull-down transistor MDO1 is coupled to a low-level input terminal configured to input a low level VGL;

the pull-down node control circuit includes a pull-down control node control sub-circuit, a pull-down node control sub-circuit, and a start pull-down sub-circuit;

the pull-down control node control sub-circuit includes:

a first pull-down control node control transistor MDC1, in which a gate electrode and a source electrode of the first pull-down control node control transistor MDC1 are both coupled a high-level input terminal of an input high level GCH, and a drain electrode of the first pull-down control node control transistor MDC1 is coupled to a pull-down control node PD_CN; and a second pull-down node control transistor MDC2, in which a gate electrode of the second pull-down node control transistor MDC2 is coupled to the pull-up node PU, a source electrode of the second pull-down node control transistor MDC2 is coupled to the pull-down control node PD_CN, and a drain electrode of the second pull-down node control transistor MDC2 is coupled to a low-level input terminal configured to input the low level VGL;

the pull-down node control sub-circuit includes:

a first pull-down node control transistor MD1, in which a gate electrode of the first pull-down node control transistor MD1 is coupled to the pull-down control node PD_CN, a source electrode of the first pull-down node control transistor MD1 is coupled to a high-level input configured to input the high-level GCH, and the drain electrode of the first pull-down node control transistor MD1 is coupled to the pull-down node PD; and a second pull-down node control transistor MD2, in which a gate electrode of the second pull-down node control transistor MD2 is coupled to the pull-up node PU, a source electrode of the second pull-down node control transistor MD2 is coupled to the pull-down node PD, and a drain electrode of the second pull-down node control transistor MD2 is coupled to a low-level input terminal configured to input the low-level VGL;

the start pull-down sub-circuit includes: a start pull-down transistor MSD, in which a gate electrode and a source electrode of the start pull-down transistor MSD are both coupled to a start terminal STV, and a drain electrode of the start pull-down transistor MSD is coupled to the pull-up node PU;

the gate electrode driving signal output circuit includes:

an output transistor MO, in which a gate electrode of the output transistor MO is coupled to the pull-up node PU, a source electrode of the output transistor MO is coupled to a first clock signal input terminal CLK, and a drain electrode of the output transistor MO is coupled to a gate electrode driving signal output terminal OUTPUT; and a storage capacitor C1, in which a first terminal of the storage capacitor C1 is coupled to the pull-up node PU, and a second terminal is of the storage capacitor C1 is coupled to the gate electrode driving signal output terminal OUTPUT;

the second pull-down circuit includes:

a second pull-down transistor MD02, in which a gate electrode of the second pull-down transistor MD02 is coupled to the pull-down node PD, a source electrode of the second pull-down transistor MDO2 is coupled to the gate electrode driving signal output terminal OUTPUT, and a drain electrode of the second pull-down transistor MD02 is coupled to a low-level input terminal configured to input the low level VGL;

the clock signal adjustment circuit includes a first node control sub-circuit 131, a second node control sub-circuit 132 and a signal output sub-circuit 133;

the first node control sub-circuit 131 includes:

a first control transistor MC1, in which a gate electrode and a source electrode of the first control transistor MC1 are both coupled to a high-level input terminal configured to input the high level GCH, and a drain electrode of the first control transistor MC1 is coupled to a first node PU1; and a second control transistor MC2, in which a gate electrode of the second control transistor MC2 is coupled to a second clock signal input terminal CLKB, a source electrode of the second control transistor MC2 is coupled to the first node PU1, and a drain electrode of the second control transistor MC2 is coupled to a low-level input terminal configured to input the low level VGL;

the second node control sub-circuit 132 includes:

a third control transistor MC3, in which a gate electrode and a source electrode of the third control transistor MC3 are both coupled to the first node PU1, and a drain electrode of the third control transistor MC3 is coupled to a second node PU2;

a fourth control transistor MC4, in which a gate electrode of the fourth control transistor MC4 is coupled to the first clock signal input terminal CLK, a source electrode of the fourth control transistor MC4 is coupled to the second node PU2, and a drain electrode of the fourth control transistor MC4 is coupled to a low-level input terminal configured to input the low level VGL;

the signal output sub-circuit 133 includes:

a first signal output transistor MO1, in which a gate electrode and a source electrode of the first signal output transistor MO1 are both coupled to the second node PU2, and a second electrode of the first signal output transistor MO1 is coupled to the clock signal adjustment output terminal CLKR;

the self-control conduction circuit 14 includes:

an auto-on transistor MZD, in which a source electrode of the auto-on transistor MZD is coupled to the clock signal adjustment output terminal CLKR, and a gate electrode and a drain electrode of the auto-on transistor MZD are both coupled to the pull-up node PU.

As shown in FIG. 7, in some embodiments of the present disclosure, all the transistors are n-type, and all the transistors but the MO1 and the MZD also may be replaced with p-type, with only the control signal timing modified accordingly.

A method for driving a shift register circuit is further provided in some embodiments of the present disclosure applying to the shift register circuit described above. The method for driving a shift register circuit includes:

loading the first clock signal to the first clock signal input terminal;

loading the second clock signal to the second clock signal input terminal.

In practical operation, in the case that the first clock signal loaded to the first clock signal input terminal and the second clock signal loaded to the second clock signal input terminal are both at the second level, outputting the first level by the clock signal adjustment circuit via the clock signal adjustment output terminal;

In the case that a potential of a pull-up node is at the first level, a self-control conduction circuit controls the clock signal adjustment output terminal to connect with the pull-up node.

In the case that a potential of a pull-up node is at the second level, a self-control conduction circuit disconnects the clock signal adjustment output terminal from the pull-up node.

According to the method for driving a shift register circuit in some embodiments of the present disclosure, in the case that the first clock signal loaded to the first clock signal input terminal and the second clock signal loaded to the second clock signal input terminal are both at the second level, the potential of the pull-up node may be controlled and maintained at the first level by the clock signal adjustment circuit and the self-control conduction circuit. Therefore, maintaining potential characteristics of the pull-up node may be enhanced, the distortion of the output waveform caused by the electricity leakage of the pull-up node and the problem of the pixel electrode mischarged may be improved, and the overall reliability of the shift register circuit may be improved.

In practical operation, the clock signal adjustment circuit includes a first node control sub-circuit, a second node control sub-circuit, and a signal output sub-circuit. Steps of, in the case that the first clock signal loaded to the first clock signal input terminal and the second clock signal loaded to the second clock signal input terminal are both at the second level, outputting the first level by the clock signal adjustment circuit via the clock signal adjustment output terminal specifically include:

The first clock signal loaded to the first clock signal input terminal and the second clock signal loaded to the second clock signal input terminal are both at the second level. The first node control sub-circuit controls the potential of the first node to be a first level according to the potential of the second clock signal. The second node control sub-circuit controls the potential of the second node to be a first level according to the potential of the first node and the potential of the first clock signal. The signal output sub-circuit controls the second node to connect with the clock signal adjustment output terminal according to the potential of the second node, so as to output the first level via the clock signal adjustment output terminal.

Specifically, the method for driving a shift register circuit in some embodiments of the present disclosure further includes:

loading a first level to a second clock signal input terminal; inputting a second level to the first clock signal input terminal; the first node control sub-circuit controls the potential of the first node to be at a second level according to an input potential of the second clock signal input terminal, the second node control sub-circuit controls the potential of the second node to be at the second level according to a potential of the first clock signal, the signal output sub-circuit controls the second node not to connect with the clock signal adjustment output terminal according to the potential of the second node;

loading a second level to a second clock signal input terminal; inputting a first level to the first clock signal input terminal; the first node control sub-circuit controls the potential of the first node to be at a first level according to the potential of the second clock signal, the second node control sub-circuit controls the potential of the second node to be at the first level according to the potential of the first node and the potential of the first clock signal, the signal output sub-circuit controls the second node not to connect with the clock signal adjustment output terminal according to the potential of the second node.

Figure 8:
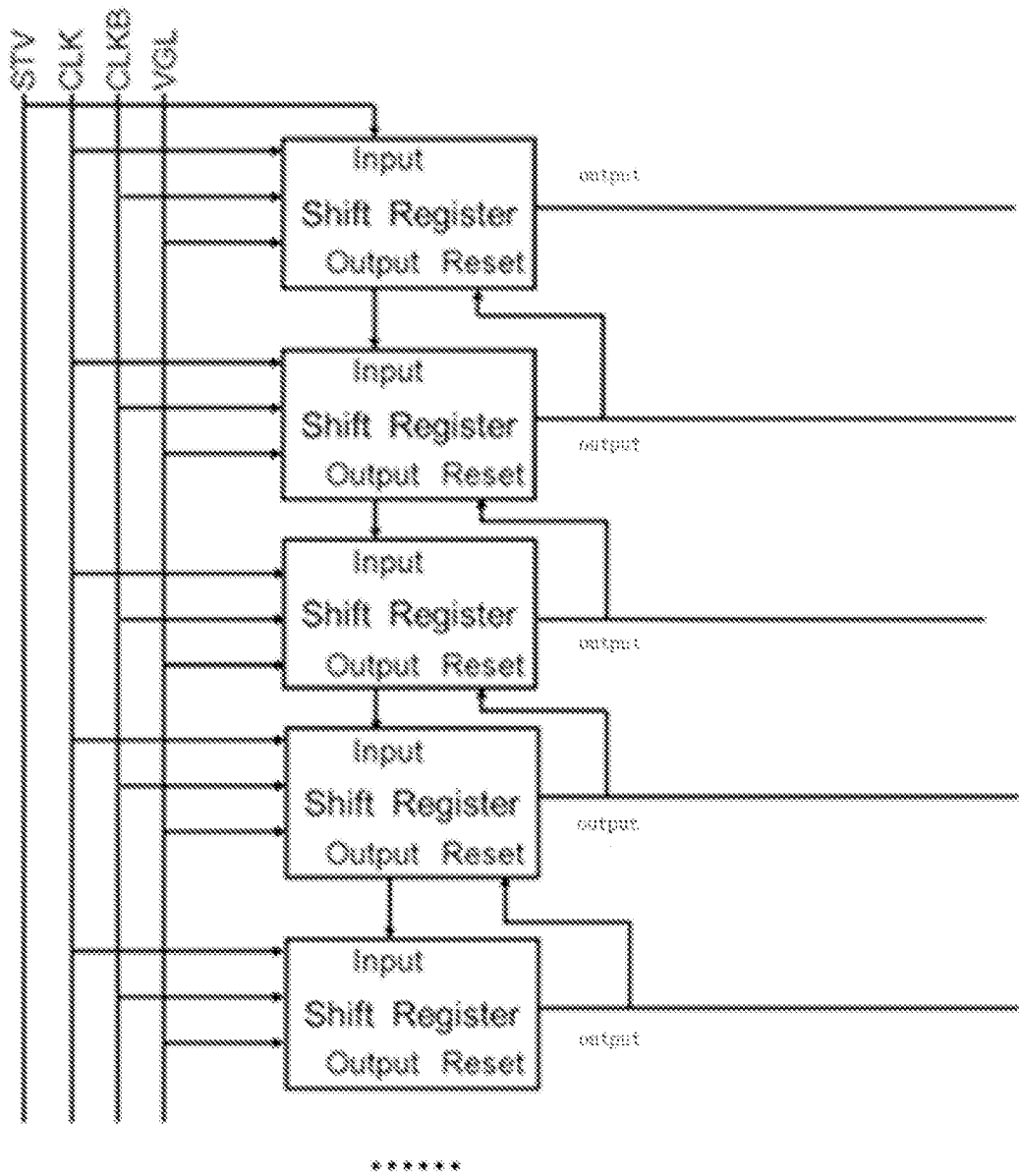
FIG. 8 is a circuit diagram of gate electrode driving circuits of a plurality of shift register circuits connected in a concatenation manner in some embodiments of the present disclosure.

Specifically, the clock signal adjustment circuit includes a first control sub-circuit, a second control sub-circuit, and a pull-up output sub-circuit. The first clock signal loaded to the first clock signal input terminal and the second clock signal loaded to the second clock signal input terminal are both at the second level. Steps of, in the case that the first clock signal loaded to the first clock signal input terminal and the second clock signal loaded to the second clock signal input terminal are both at the second level, outputting the first level by the clock signal adjustment circuit via the clock signal adjustment output terminal specifically include:

The first clock signal loaded to the first clock signal input terminal and the second clock signal loaded to the second clock signal input terminal are both at the second level; the first control sub-circuit controls a first control node to couple to a first level input terminal according to the potential of the first clock signal, the second control sub-circuit controls a second control node to couple to a first control node and controls the second control node not to connect with the second level input terminal according to the potential of a second clock signal; so that the potential of the second control node is at the first level; the pull-up output sub-circuit controls the second control node to connect with the clock signal adjustment output terminal according to the potential of the second control node;

in the case that the potential of the pull-up node is at the first level, the pull-up output sub-circuit controls the clock signal adjustment output terminal to connect with the pull-up node according to the potential of the pull-up node;

in the case that the potential of the pull-up node is at the second level, the pull-up output sub-circuit controls the clock signal adjustment output terminal to disconnect from the pull-up node according to the potential of the pull-up node;

A gate electrode driving circuit is provided in some embodiments of the present disclosure, including a plurality of cascaded shift register circuits as described above. As shown in FIG. 8, the input terminal of a first stage of a shift register circuit is coupled to a start terminal STV; a clock signal input terminal CLK and a CLKB are coupled to each stage of the shift register circuit; the input terminal of the next stage of the shift register circuit is coupled to a output terminal of the previous stage of the shift register circuit.

A display device is further provided in some embodiments of the present disclosure, including a gate driving circuit as described above.

The above are merely some embodiments of the present disclosure. It should be noted that, a person skilled in the art may make further modifications and improvements without departing from the principle of the present disclosure, and these modifications and improvements shall also fall within the scope of the present disclosure.

What is claimed is:

1. A shift register circuit, comprising a clock signal adjustment circuit and a self-control conduction circuit, wherein the clock signal adjustment circuit comprises a first clock signal input terminal, a second clock signal input terminal and a clock signal adjustment output terminal; the self-control conduction circuit is coupled to the clock signal adjustment output terminal and a pull-up node;

the first clock signal input terminal is configured to load a first clock signal, the second clock signal input terminal is configured to load a second clock signal, wherein both the first clock signal and the second clock signal have a first level and a second level, wherein the first level is an active operating level and is higher than a reference level;

the clock signal adjustment circuit is configured to, in the case that the first clock signal and the second clock signal are both at the second level, output the first level via the clock signal adjustment output terminal, wherein the second level is lower than the reference level;

the self-control conduction circuit is configured to, in the case that the pull-up node is at the first level, control the clock signal adjustment output terminal to connect with the pull-up node, or the self-control conduction circuit is configured to, in the case that the pull-up node is at the second level, disconnect the clock signal adjustment output terminal from the pull-up node, wherein a duty ratio of the first clock signal and a duty ratio of the second clock signal are both less than 50%; a period of the first clock signal is the same as a period of the second clock signal, and a phase difference between the first clock signal and the second clock signal is 180°.

2. The shift register circuit according to claim 1, wherein the self-control conduction circuit comprises a self-control conduction transistor, wherein a gate electrode of the self-control conduction transistor is coupled to the pull-up node, a first electrode of the self-control conduction transistor is coupled to the clock signal adjustment output terminal, and a second electrode of the self-control conduction circuit is coupled to the pull-up node.

3. The shift register circuit according to claim 2, wherein the self-control conduction transistor is an n-type transistor.

4. A gate electrode driving circuit comprising a plurality of shift register circuits connected in a cascade manner according to claim 1.

5. A display device comprising a gate electrode driving circuit according to claim 4.

6. A method for driving a shift register circuit according to claim 1, comprising:
  loading the first clock signal to the first clock signal input terminal;
  loading the second clock signal to the second clock signal input terminal;
  in the case that the first clock signal and the second clock signal are both at the second level, outputting, by the clock signal adjustment circuit, the first level via the clock signal adjustment output terminal; and
  in the case that the pull-up node is at the first level, controlling, by the self-control conduction circuit, the clock signal adjustment output terminal to connect with the pull-up node; or in the case that the pull-up node is at a second level, disconnecting, by the self-control conduction circuit, the clock signal adjustment output terminal from the pull-up node.

7. A shift register circuit, comprising a clock signal adjustment circuit and a self-control conduction circuit, wherein
  the clock signal adjustment circuit comprises a first clock signal input terminal, a second clock signal input terminal and a clock signal adjustment output terminal; the self-control conduction circuit is coupled to the clock signal adjustment output terminal and a pull-up node;
  the first clock signal input terminal is configured to load a first clock signal, the second clock signal input terminal is configured to load a second clock signal, wherein both the first clock signal and the second clock signal have a first level and a second level, wherein the first level is an active operating level and is higher than a reference level;
  the clock signal adjustment circuit is configured to, in the case that the first clock signal and the second clock signal are both at the second level, output the first level via the clock signal adjustment output terminal, wherein the second level is lower than the reference level;
  the self-control conduction circuit is configured to, in the case that the pull-up node is at the first level, control the clock signal adjustment output terminal to connect with the pull-up node, or the self-control conduction circuit is configured to, in the case that the pull-up node is at the second level, disconnect the clock signal adjustment output terminal from the pull-up node,
  wherein the clock signal adjustment circuit comprises:
  a first node control sub-circuit, coupled to a first level input terminal, the second clock signal input terminal, a first node and a second level input terminal, and configured to control a potential of the first node according to a potential of the second clock signal,
  a second node control sub-circuit, coupled to the first node, a second node, the first clock signal input terminal and the second level input terminal, and configured to control a potential of the second node according to a potential of the first clock signal and the potential of the first node; and
  a signal output sub-circuit, coupled to the second node and the clock signal adjustment output terminal, and configured to control, according to the potential of the second node, whether the second node is connected with the clock signal adjustment output terminal.

8. The shift register circuit according to claim 7, wherein the first node control sub-circuit comprises:
  a first control transistor, wherein both a gate electrode of the first control transistor and a first electrode of the first control transistor are coupled to the first level input terminal, and a second electrode of the first control is coupled to the first node; and
  a second control transistor, wherein a gate electrode of the second control transistor is coupled to the second clock signal input terminal, a first electrode of the second control transistor is coupled to the first node, and a second electrode of the second control transistor is coupled to the second level input terminal;
  the second node control sub-circuit comprises:
  a third control transistor, wherein both a gate electrode and a first electrode of the third control transistor are coupled to the first node, and a second electrode of the third control transistor is coupled to the second node; and
  a fourth control transistor, wherein a gate electrode of the fourth control transistor is coupled to the first clock signal input terminal, a first electrode of the fourth control transistor is coupled to the second node, and a second electrode of the fourth control transistor is coupled to the second level input terminal;
  the signal output sub-circuit comprises:
  a signal output transistor, wherein both a gate electrode and a first electrode of the signal output transistor are coupled to the second node, and a second electrode of the signal output transistor is coupled to the clock signal adjustment output terminal.

9. The shift register circuit according to claim 8, wherein both the first control transistor and the second control transistor are n-type transistors, the first level input terminal is a high-level input terminal, and the second level input terminal is a low-level input terminal; both the third control transistor and the fourth control transistor are n-type transistors; the signal output transistor is an n-type transistor.

10. The shift register circuit according to claim 8, further comprising: a first pull-down circuit, a pull-down node control circuit, a gate electrode driving signal output circuit and a second pull-down circuit, wherein the first pull-down circuit comprises a first pull-down transistor, wherein a gate electrode of the first pull-down transistor is coupled to the pull-down node, a first electrode of the first pull-down transistor is coupled to the pull-up node, and a second electrode of the first pull-down transistor is coupled to the second level input terminal.

11. The shift register circuit according to claim 10, wherein the pull-down node control circuit comprises a pull-down control node control sub-circuit, a pull-down node control sub-circuit and a start pull-down sub-circuit, wherein
  the pull-down control node control sub-circuit comprises:
  a first pull-down control node control transistor, wherein both a gate electrode and a first electrode of the first pull-down control node control transistor is coupled to the first level input terminal, a second electrode of the first pull-down control node control transistor is coupled to the pull-down control node; and
  a second pull-down node control transistor, wherein a gate electrode of the second pull-down node control transistor is coupled to the pull-up node, a first electrode of the second pull-down node control transistor is coupled to the pull-down control node, and a second electrode of the second pull-down node control transistor is coupled to the second level input terminal;
  the pull-down node control sub-circuit comprises:
  a first pull-down node control transistor, wherein a gate electrode of the first pull-down node control transistor is coupled to the pull-down control node, a first electrode of the first pull-down node control transistor is coupled to the first level input terminal, and a second electrode of the first pull-down node control transistor is coupled to the pull-down node; and a second pull-down node control transistor, wherein a gate electrode of the second pull-down node control transistor is coupled to the pull-up node, a first electrode of the second pull-down node control transistor is coupled to the pull-down node, and a second electrode of the second pull-down node control transistor is coupled to the second level input terminal;

the start pull-down sub-circuit comprises a start pull-down transistor, wherein both a gate electrode and a first electrode of the start pull-down sub-circuit are coupled to the start terminal, and a second electrode of the start pull-down sub-circuit is coupled to the pull-up node.

12. The shift register circuit according to claim 11, wherein the gate electrode driving signal output circuit comprises:

an output transistor, wherein a gate electrode of the output transistor is coupled to the pull-up node, a first electrode of the output transistor is coupled to the first clock signal input terminal, and a second electrode of the output transistor is coupled to the gate electrode driving signal output terminal; and a storage capacitor, wherein a first terminal of the storage capacitor is coupled to the pull-up node, and a second terminal of the storage capacitor is coupled to the gate electrode driving signal output terminal;

the second pull-down circuit comprises: a second pull-down transistor, wherein a gate electrode of the second pull-down transistor is coupled to the pull-down node, a first electrode of the second pull-down transistor is coupled to the gate electrode driving signal output terminal, and a second electrode of the second pull-down transistor is coupled to the low-level input terminal.

13. A shift register circuit, comprising a clock signal adjustment circuit and a self-control conduction circuit, wherein the clock signal adjustment circuit comprises a first clock signal input terminal, a second clock signal input terminal and a clock signal adjustment output terminal;

the self-control conduction circuit is coupled to the clock signal adjustment output terminal and a pull-up node;

the first clock signal input terminal is configured to load a first clock signal, the second clock signal input terminal is configured to load a second clock signal, wherein both the first clock signal and the second clock signal have a first level and a second level, wherein the first level is an active operating level and is higher than a reference level;

the clock signal adjustment circuit is configured to, in the case that the first clock signal and the second clock signal are both at the second level, output the first level via the clock signal adjustment output terminal, wherein the second level is lower than the reference level;

the self-control conduction circuit is configured to, in the case that the pull-up node is at the first level, control the clock signal adjustment output terminal to connect with the pull-up node, or the self-control conduction circuit is configured to, in the case that the pull-up node is at the second level, disconnect the clock signal adjustment output terminal from the pull-up node, wherein the clock signal adjustment circuit comprises:

a first control sub-circuit, coupled to the first clock signal input terminal, a first level input terminal and a first control node, and configured to control, according to a potential of the first clock signal, whether the first control node is connected with the first clock node;

a second control sub-circuit, coupled to the second clock signal input terminal, a second control node, the first control node and a second level input terminal, and configured to control, according to a potential of the second clock signal, whether the second control node is connected with the first control node and whether the second control node is connected with the second level input terminal; and a pull-up output sub-circuit, coupled to the second control node and the clock signal adjustment output terminal, and configured to control, according to the potential of the second control node, whether the second control node is coupled to the clock signal adjustment output terminal.

14. The shift register circuit according to claim 13, wherein the first control sub-circuit comprises a first control transistor, wherein a gate electrode of the first control transistor is coupled to the first clock signal input terminal, a first electrode of the first control transistor coupled to the first level input terminal, and a second electrode of the first control transistor is coupled to the first control node;

the second control sub-circuit comprises a second control transistor, wherein a gate electrode of the second control transistor is coupled to the second clock signal input terminal, a first electrode of the second control transistor is coupled to the first control node, and a second electrode of the second control transistor is coupled to the second control node; and a third control transistor, wherein a gate electrode of the third control transistor is coupled to the second clock signal input terminal, a first electrode of the third control transistor is coupled to the second control node, and a second electrode of the third control transistor is coupled to a low-level input terminal;

the pull-up output sub-circuit comprises:

a pull-up output transistor, wherein both a gate electrode and a first electrode of the pull-up output transistor are coupled to the second control node, and a second electrode of the pull-up output transistor is coupled to the clock signal adjustment output terminal.

15. The shift register circuit according to claim 14, wherein both the first control transistor and the second control transistor are p-type transistors, and both the third control transistor and the pull-up output transistor are n-type transistors.

* * * * *